United States Patent [19]

Tatsumi et al.

[11] Patent Number: 5,138,579
[45] Date of Patent: Aug. 11, 1992

[54] SEMICONDUCTOR MEMORY DEVICE HAVING TRANSFER GATES WHICH PREVENT HIGH VOLTAGES FROM BEING APPLIED TO MEMORY AND DUMMY CELLS IN THE READING OPERATION

[75] Inventors: Yuuichi Tatsumi, Tokyo; Hidenobu Minagawa, Kawasaki; Hiroshi Iwahashi, Yokohama; Masamichi Asano, Tokyo; Mizuho Imai, Annaka, all of Japan

[73] Assignee: Kabushiki Kaisha Toshiba, Kawasaki, Japan

[21] Appl. No.: 632,613

[22] Filed: Dec. 26, 1990

Related U.S. Application Data

[63] Continuation of Ser. No. 226,095, Jul. 29, 1988, abandoned.

[30] Foreign Application Priority Data

Jul. 31, 1987 [JP] Japan .................... 62-191603

[51] Int. Cl.$^5$ ................................. G11C 7/00
[52] U.S. Cl. ................................ 365/203; 365/210; 365/208; 365/189.09
[58] Field of Search ............... 365/189.09, 207, 208, 365/210, 203, 185

[56] References Cited

U.S. PATENT DOCUMENTS

| | | | |
|---|---|---|---|
| 4,223,394 | 9/1980 | Pathak et al. | 365/210 |
| 4,475,178 | 10/1984 | Kinoshita | 365/203 |
| 4,694,427 | 9/1987 | Miyamoto et al. | 365/210 X |
| 4,730,279 | 3/1988 | Ohtani | 365/203 |
| 4,792,928 | 12/1988 | Tobita | 365/207 X |
| 4,884,241 | 11/1989 | Tanaka et al. | 365/210 |

FOREIGN PATENT DOCUMENTS 0175102 3/1986 European Pat. Off.

OTHER PUBLICATIONS

William Ip, Te-Long Chiu, Tsung-Ching Wu, Gust Perlegos, 1984 ISSCC Digest of Technical Papers, IEEE p. 138 (Feb. 23, 1984).
Jeffrey M. Schlageter, et al; 1976 ISSCC, Digest of Technical Papers, IEEE p. 136 (Feb. 19, 1976).

Primary Examiner—Andrew L. Sniezek
Attorney, Agent, or Firm—Finnegan, Henderson, Farabow, Garrett and Dunner

[57] ABSTRACT

A semiconductor memory device includes word lines selectively driven by a signal from a row decoder, memory cells connected to word lines, first and second data lines, a bit line connected to receive data from the memory cell and to supply received data to the first data lines, dummy cells connected to word lines, first and second dummy data lines, a dummy bit lines connected to receive data from the dummy memory cell and to supply received data to the first dummy data line, a data sensing circuit for generating an output signal corresponding to a potential difference between the second data line and second dummy data line, a first MOS transistor connected between the first and second data lines, a first load circuit for charging the second data line, a second MOS transistor connected between the first and second dummy data lines, and a second load circuit for charging the second dummy data lines. The memory device further includes a first equalizer circuit connected between the second data line and dummy data line and equalizing potentials at both ends during a predetermined period of time after the semiconductor memory device is set in the active mode, and a second equalizer circuit connected between the data line and dummy data line and equalizing potential as at both ends during a predetermined period of time after the memory device is set in the active mode.

35 Claims, 9 Drawing Sheets

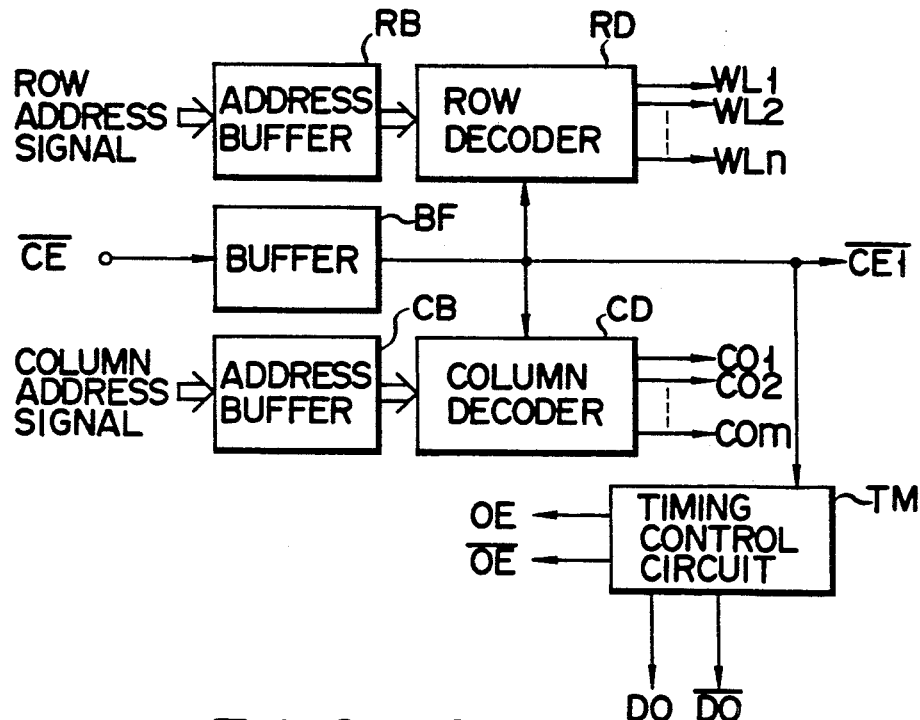
F I G. 3B
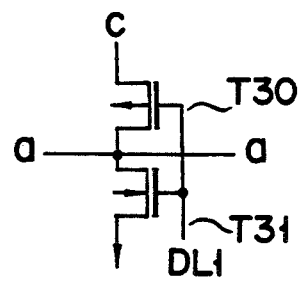
F I G. 4

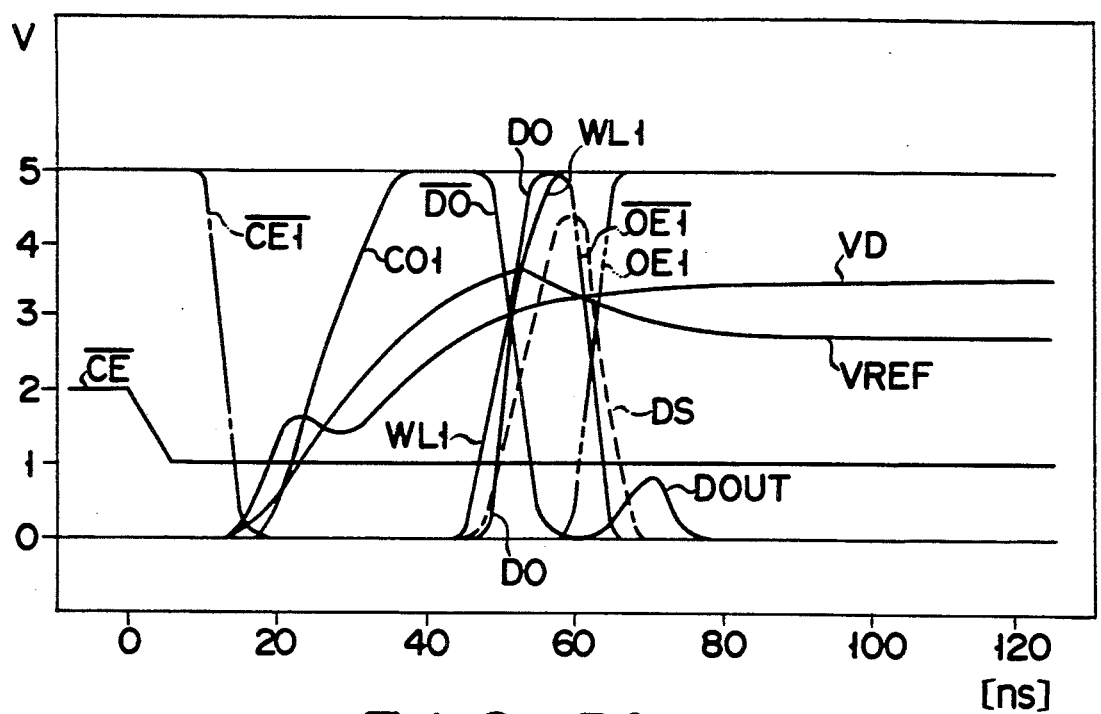
F I G. 5A
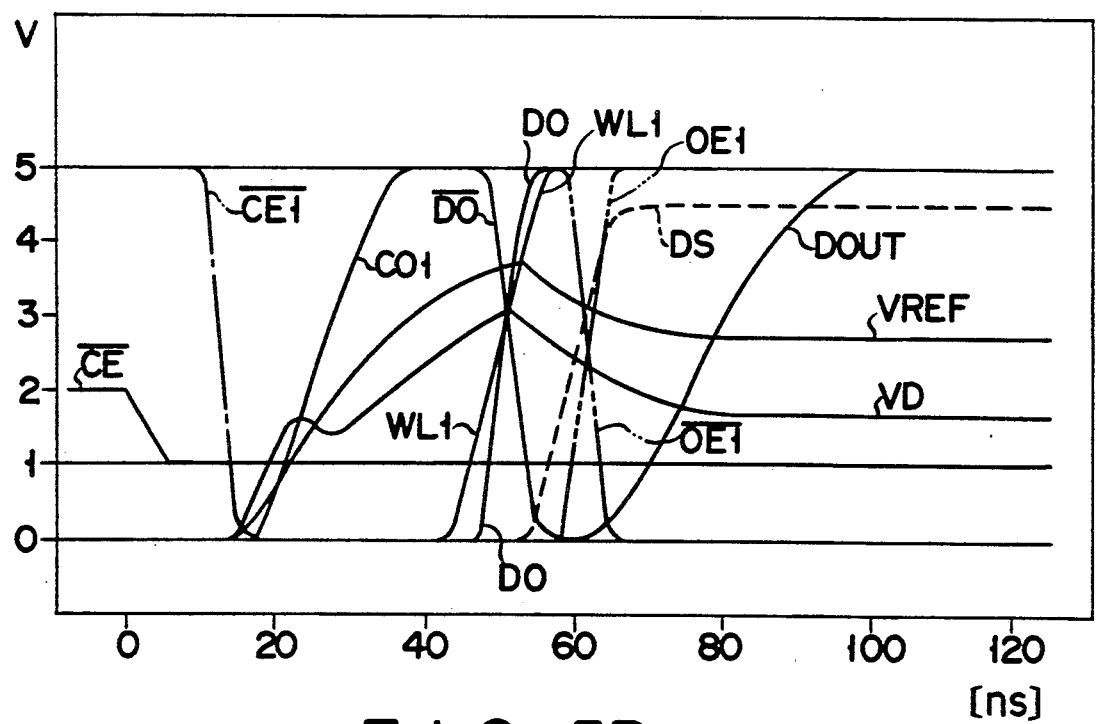
F I G. 5B

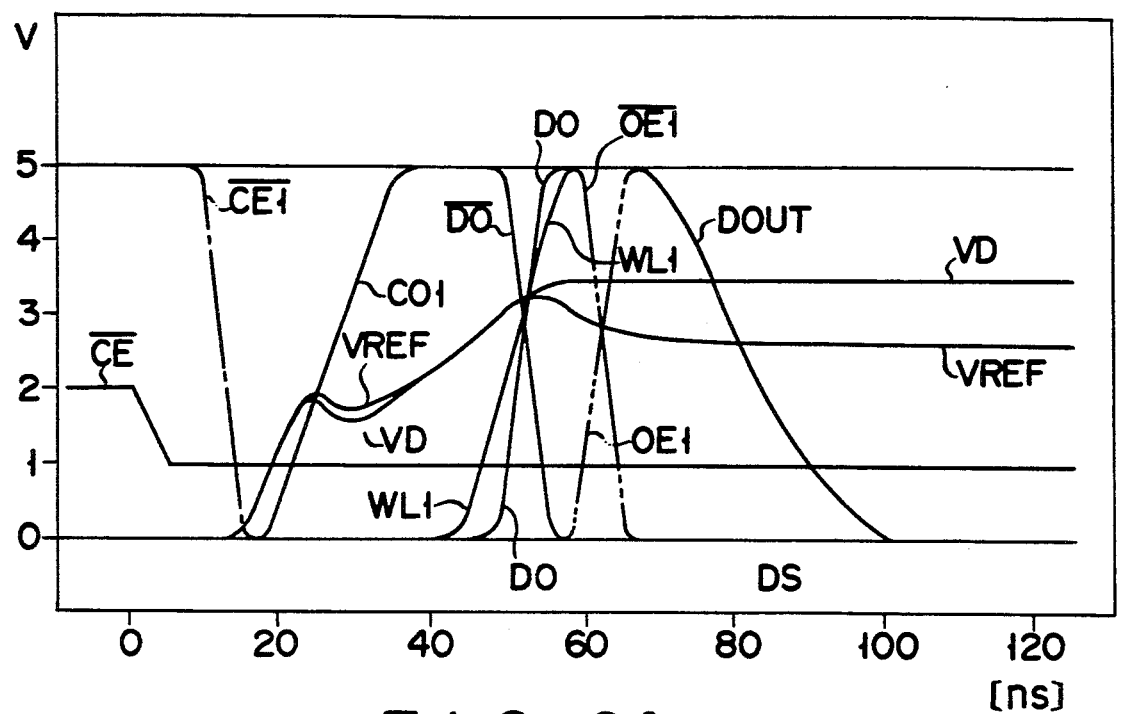
F I G. 6A
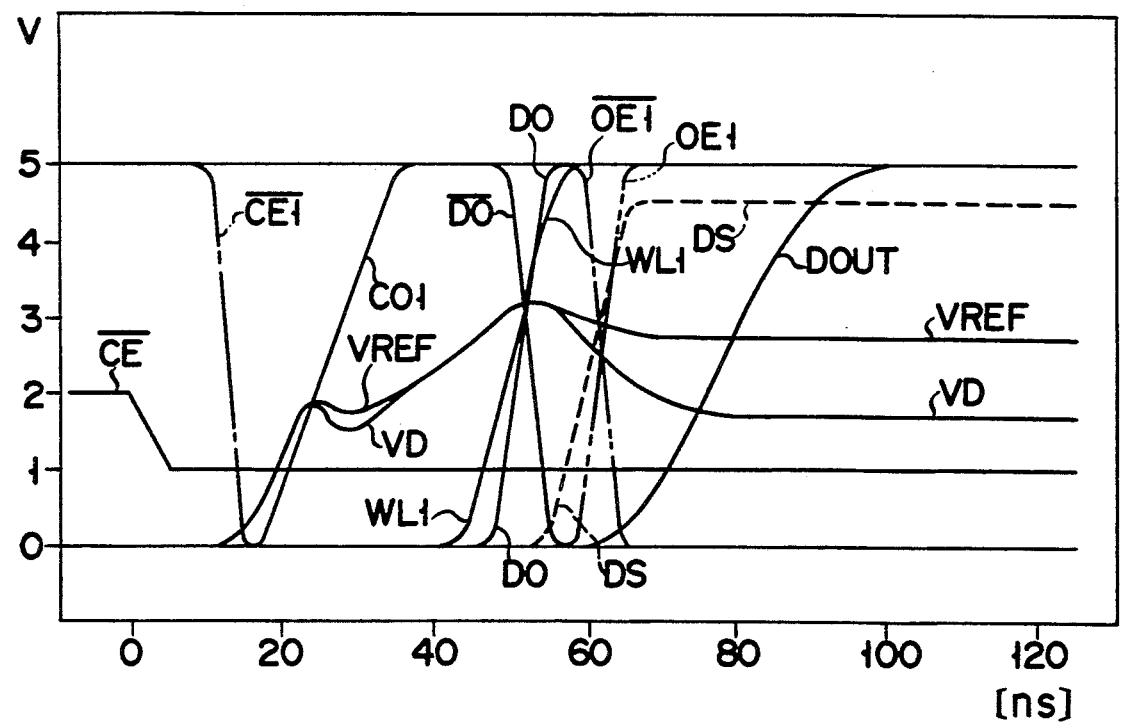
F I G. 6B

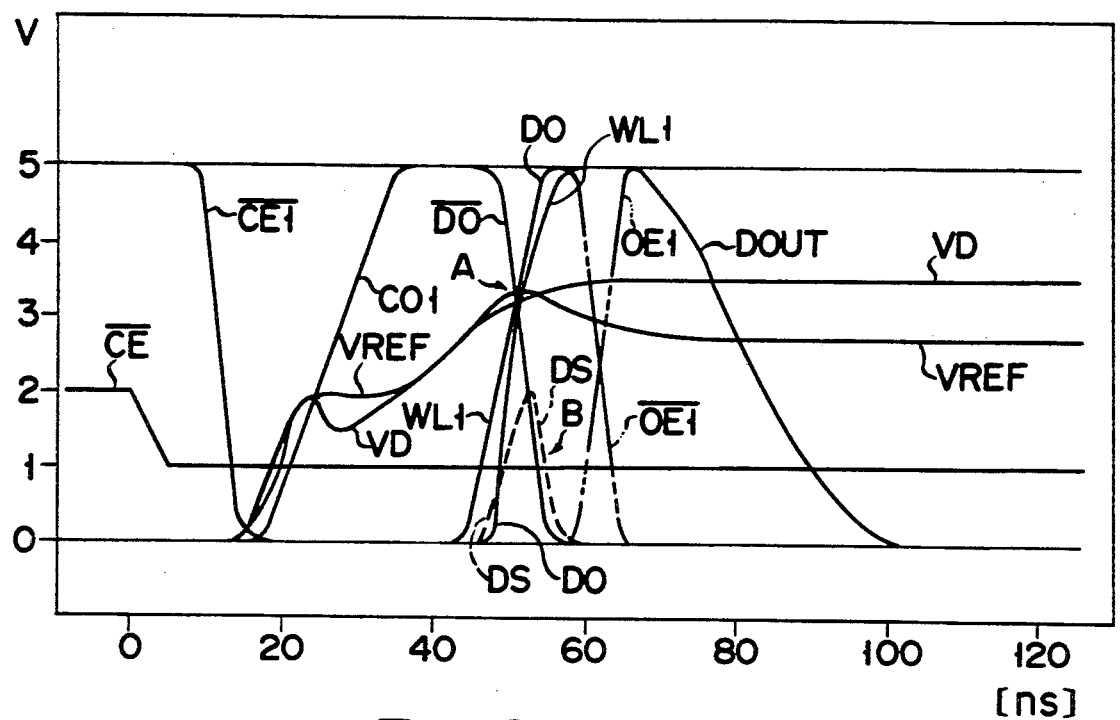
F I G. 7A
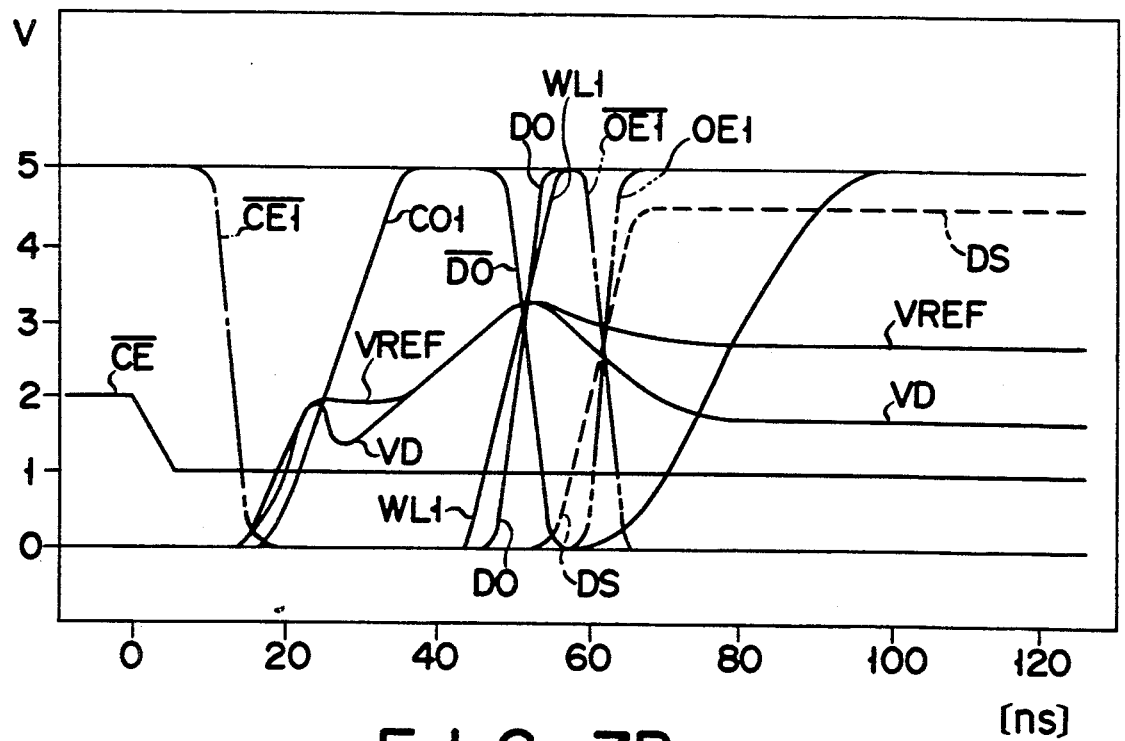
F I G. 7B

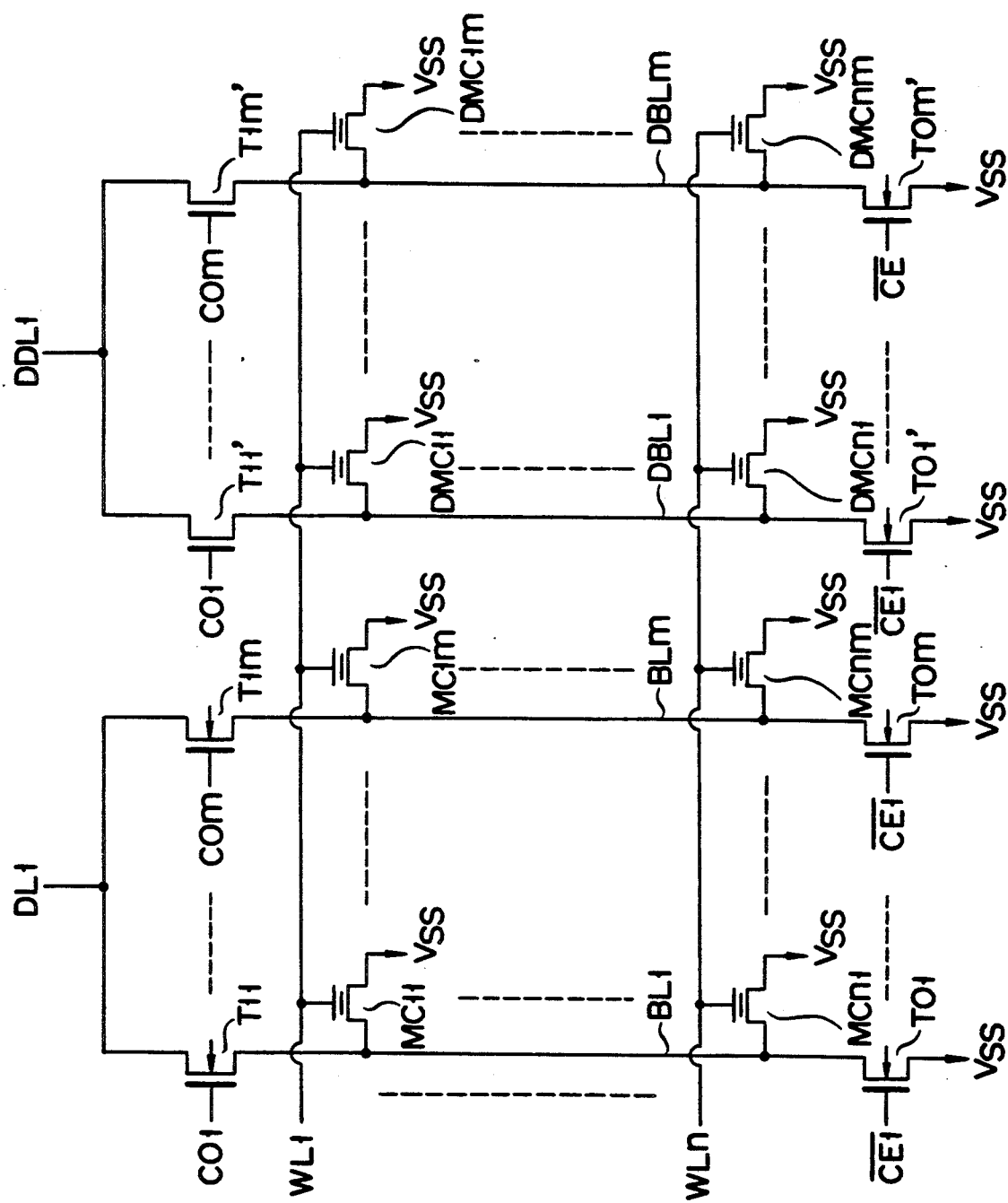
F I G. 9

SEMICONDUCTOR MEMORY DEVICE HAVING TRANSFER GATES WHICH PREVENT HIGH VOLTAGES FROM BEING APPLIED TO MEMORY AND DUMMY CELLS IN THE READING OPERATION

This application is a continuation, of application Ser. No. 07/226,095, filed Jul. 29, 1988 now abandoned.

BACKGROUND OF THE INVENTION

1. Field of the Invention

This invention relates to a semiconductor memory device, and more particularly to an EPROM in which readout data is detected according to the potential difference between a memory cell output and a dummy cell output.

2. Description of the Related Art

A semiconductor memory device generally has an input terminal connected to receive a chip enable signal $\overline{CE}$ which is used to selectively set the semiconductor memory device into an active state or standby state. In connection with the control, chip enable signal $\overline{CE}$ is supplied from the input terminal to a buffer amplifier and is converted to a chip enable signal $\overline{CE1}$ having an amplitude suitable for a memory circuit. In general, the memory circuit is set into the standby or active mode when chip enable signal $\overline{CE1}$ is at "1" or "0" level, respectively. In the standby state, it is prevented that current unnecessarily flows in the memory device. Therefore, the power consumption in the standby state is lower than that in the active state.

FIG. 1 is a diagram schematically showing the memory circuit of the conventional EPROM. In this memory circuit, floating gate type memory cells are used. The readout operation is effected by a power source voltage supplied from power source terminal VCC when chip enable signal $\overline{CE1}$ is at "0" level. In the readout mode, a row decoder RD decodes a row address signal to selectively supply a readout voltage to one of word lines WL1 is WLn, and a column decoder CD decodes a column address signal to selectively turn on one of MOS transistors T11 to T1m. For example, when memory cell MC11 is specified by row and column address signals, a readout voltage is supplied to memory cell MC11 via word line WL1. At this time, the conduction state of memory cell MC11 is determined according to the stored data. That is, the memory cell MC11 is turned on or off when the stored data is "1" or "0", respectively. The stored data is read out by detecting the potential of bit line BL1 which is set according to the conduction state of memory cell MC11. The readout data is supplied to data line DL1 via MOS transistor T11, and is also supplied to sensing circuit 2 via MOS transistor T8 and data line DL2. Sensing circuit 2 compares input potential VD corresponding to the readout data with reference potential VREF supplied from reference potential generating circuit RS, and generates output signal "0" or "1" according to the potential difference therebetween. Thus, sensing circuit 2 supplies an output signal to drive output circuit 1 which in turn supplies output data of the logic value corresponding to the readout data to the exterior. Reference potential VREF is set to a potential level between potentials of data line DL2 respectively set when data "1" and "0" are read out.

In the EPROM, as shown in FIG. 1, reference potential generating circuit RS is formed to have a construction equivalent to that of main body circuit MS. With this construction, the condition in which the potential of dummy data line DDL2 or reference potential VREF is set according to dummy data read out from one of dummy cells DMC1 to DMCn can be set to correspond to that in which the potential of data line DL2 is set according to data read out from one of memory cells MC11 to MCnm. However, it is necessary to constitute reference potential generating circuit RS so as to set reference potential VREF to a preset potential level, and therefore it cannot be formed to have exactly the same construction as main body circuit MS. For example, N-channel MOS transistor T0 is formed to correspond to N-channel MOS transistors T1 to T1m, but the gate of N-channel MOS transistor T0 is connected to power source terminal VCC which is set at 5 V, and therefore, unlike MOS transistors T11 to T1m, MOS transistor T0 is kept set in the conductive state. Further, load transistor T1 for the dummy cell has a larger current supplying ability than that of load transistor T2 for the memory cell to set reference voltage VREF to a potential level between the potentials of data line DL2 respectively set when data "1" and "0" are read out.

The conventional construction described above may cause unwanted data to be read out after the memory circuit is activated. When chip enable signal $\overline{CE1}$ is at "1" level, that is, when the memory circuit is set in the standby mode, data lines DL1 and DL2 and data lines DDL1 and DDL2 are set at 0 V. When chip enable signal $\overline{CE1}$ falls from "1" level to "0" level, a charging current flows from power source terminal VCC into data lines DL2 and DL1 via load MOS transistors T2 and T7, and at the same time into data lines DDL2 and DDL1 via load MOS transistors T1 and T9. The potentials of data lines DL1, DL2, DDL1 and DDL2 rise from 0 V by the charging operation of load MOS transistors T2, T7, T1 and T9. At this time, row decoder RD, column decoder CD, sensing circuit 2 and output circuit 1 are also started to operate at the time of fall of chip enable signal CE1. As shown in FIGS. 2A and 2B, potential VD of data line DL2 rises at a higher rate in comparison with potential VREF on data line DDL2. This is because data lines DL1 and DL2 are electrically isolated from bit lines BL1 to BLM while the parasitic capacitance associated with bit line DBL is charged together with the parasitic capacitances associated with data lines DDL1 and DDL2 via MOS transistor T0. Output signals CO1 to COm from column decoder are set at "0" level during the period in which chip enable signal $\overline{CE1}$ is set at "1" level. The decoding operation of column decoder CD is started when chip enable signals $\overline{CE1}$ falls to "0" level. After the decoding operation has finished, one of output signals CO1 to COm is set at "1" level to turn on a corresponding one of MOS transistors T11 to T1m. Therefore, the timing that one of bit lines BL1 to BLm is electrically connected to data lines DL1 and DL2 via the corresponding MOS transistor is to the response time of column decoder CD. When potential VD becomes higher than potential VREF, sensing circuit 2 sets the potential of data line DS to "0" level, and an output potential of output circuit 1 is set to "0" level as data "0".

When gate voltage CO1 of MOS transistor T11 is raised by column decoder CD according to the decoding result, for example, MOS transistor T11 is turned on to electrically connect bit line BL1 to data line DL1. At this time, part of charges stored in the parasitic capacitance of data lines DL1 and DL2 is supplied to the parasitic capacitance of bit line BL1, and potential VD of data line DL2 is lowered and then is raised again. When potential VD of data line DL2 becomes lower than potential VREF of data line DDL2 as shown in FIGS. 2A and 2B, sensing circuit 2 sets the potential of data line DS to "1" level, and the output potential of output circuit 2 is changed to "1" level as data "1".

The decoding operation of row decoder RD is completed with a delay time with respect to the decoding operation of column decoder CD. For example, if row decoder RD raises the potential of word line WL1 based on the decoding result, the potential of bit line BL1 is set according to the conduction state of memory cell MC11 and at the same time the potential of bit line DBL is set according to the conduction state of dummy cell DMC. At this time, potential VREF of data line DDL2 is lowered and set at a predetermined level.

For example, in a case where data "0" is stored in memory cell MC11, potential VD of data line DL2 is further raised and set to a potential level higher than potential VREF as shown in FIG. 2A When potential VD of data line DL2 becomes higher than potential VREF of data line DDL2, sensing circuit 2 sets the potential of data line DS to "0" level, and the output potential of output circuit 1 is changed to "0" level as data "0". Reference potential VREF rises at a higher rate than potential VD after MOS transistor T11 is turned on. This is because load transistor T1 has a larger current supplying ability than load transistor T2 as described above. In this case, the time required for potential VD to be set at a higher level than potential VREF becomes longer.

In contrast, in a case where data "1" is stored in memory cell MC11, rise in potential VD of data line DL2 is stopped and potential VD is set at a potential level lower than potential VREF as shown in FIG. 2B. When potential VD of data line DL2 becomes lower than potential VREF of data line DDL2, sensing circuit 2 sets the potential of data line DS to "0" level and the output potential of output circuit 1 is kept at "1" level as data "1".

In a case where data read out from the memory cell is "0", output data Dout is first set to "1" and then changed to "0". In this case, time required for determining output data Dout becomes longer by the time for discharging the charge stored in output terminal PD. On the other hand, when output terminal PD is alternately charged and discharged in a short period of time, power source noise can be produced.

In the prior art method, in order to prevent unwanted data from being output, time for starting to operate sensing circuit 2 and the load circuits in reference potential generating circuit RS and main circuit MS after the rise of chip enable signal $\overline{CEI}$ is further delayed. In this case, the above circuits are operated after data has been read out from a selected memory cell, thus preventing unwanted data from being supplied from output circuit 1.

However, in this method, since the operation of charging data lines DL1 and DL2 and dummy data lines DDL1 and DDL2 is started after the load circuits in reference potential generating circuit RS and main circuit MOS transistor have been operated, it will be impossible to sufficiently shorten the time for the data readout operation.

Further, in order to solve this problem, a method of holding the bit and dummy bit lines at a preset potential in the standby mode is provided. With this method, even if the load circuits of reference potential generating circuit RS and main circuit MS are operated after data has been read out from a selected memory cell, data can be exactly read out at a high speed because the operation of charging the bit line has already been completed. However, if the preset potential is kept applied to the bit line, the memory cell connected to the bit line may be influenced, and if the memory cell is of a floating gate type, data may be destroyed, as described below:

In the floating gate type EPROM cell, the state in which electrons are injected into the floating gate to raise the threshold voltage indicates data "0" and the state in which electrons are not injected to hold the originally set threshold voltage indicates data "1". Therefore, if the preset voltage is kept applied to the data line as described before, a potential is applied to the drain of the EPROM cell transistor so that the electrons in the floating gate may be moved into the drain, thus lowering the threshold voltage. As a result, the content of the memory cell may be sometimes changed from "0" to "1".

SUMMARY OF THE INVENTION

An object of this invention is to provide a memory cell in which data can be read out at a high speed without causing a problem that cell data is erroneously changed.

This object can be attained by a semiconductor memory device comprising row lines selectively driven by a signal from a row decoder, memory cells connected to the row lines, a column line connected to receive data from the memory cell, dummy cells, a dummy column line connected to receive data from the dummy cell, a data sensing circuit connected to receive at a first input terminal a potential of data supplied from the column line and receive at a second input terminal a potential supplied from the dummy column line for generating an output signal corresponding to a difference between the input potentials, a first transfer gate transistor having a current path inserted between a first portion of the column line, which is connected to the memory cells, and a second portion of the column line, which is connected to the first input terminal of the data sensing circuit, a first load circuit connected to the second portion of the column line and being driven in a period of time in which said semiconductor memory device is set in the active state, a second transfer gate transistor having a current path inserted between a first portion of the dummy column line, which is connected to the dummy cells, and a second portion of said dummy column line, which is connected to the second input terminal of said data sensing circuit, a second load circuit connected to the second portion of the dummy column line and being driven in a period of time in which the semiconductor memory device is set in the active state, a first equalizer circuit connected between the second portions of said column and dummy column lines and equalizing potentials at both ends during a predetermined period of time after the semiconductor memory device is set in the active mode, thereby causing the potential difference between the both ends to be reduced or equal to zero, and a second equalizer circuit connected between the first portions of the column and dummy column lines and equalizing potentials at both ends during a predetermined period of time after the semiconductor memory device is set in the active mode, thereby causing the potential difference between the both ends to be reduced or equal to zero.

In the semiconductor memory device with the construction described above, when the memory device is activated, the column is charged by means of the first load circuit at a high speed and the dummy column line is charged by means of the second load circuit at a high speed. Further, the potential difference between that portion of the column line which is connected to the data sensing circuit and that portion of the dummy column line which is connected to the data sensing circuit is reduced or set to zero by means of the first equalizer circuit, and the potential difference between that portion of the column line which is connected to the memory cells, and that portion of the dummy data line, which is connected to the dummy cells line is reduced or set to zero by means of the second equalizer circuit. Therefore, potentials of two input terminals of the data sensing circuit become close to each other when the potential of the row line reaches the preset level. After the potential of the row line has reached the preset potential and data has been read out from the memory cell, the potential of one of the input terminals of the data sensing circuit will vary according to the readout data. In this way, unstable data will not be supplied to the exterior and data can be read out at a high speed because of the high charging operation by the first and second load circuits. Further, since the column line is charged after the chip enable signal is activated, there is no possibility that cell data may be destroyed by applying a high potential to the column line in the standby mode.

BRIEF DESCRIPTION OF THE DRAWINGS

FIGS. 3A and 3B are circuit diagrams showing the construction of a memory circuit of an EPROM according to one embodiment of this invention;

FIG. 4 is a circuit diagram showing the construction of an inverter constituting a bias circuit used in the memory circuit of FIGS. 3A and 3B;

FIGS. 5A and 5B are waveform diagrams of signals in the memory circuit of FIGS. 3A and 3B in a case where equalizing circuits are omitted from the memory circuit;

FIGS. 6A and 6B are waveform diagrams of signals to illustrate the operation of the memory circuit of FIGS. 3A and 3B;

FIGS. 7A and 7B are waveform diagrams of signals in the memory circuit of FIGS. 3A and 3B is a case where one of the equalizing circuits is omitted from the memory circuit;

FIG. 9 is a modification of the memory circuit of FIGS. 3A and 3B.

DETAILED DESCRIPTION OF THE PREFERRED EMBODIMENTS

There will now be described an EPROM according to one embodiment of this invention with reference to FIGS. 3A and 3B.

Figure 1A:
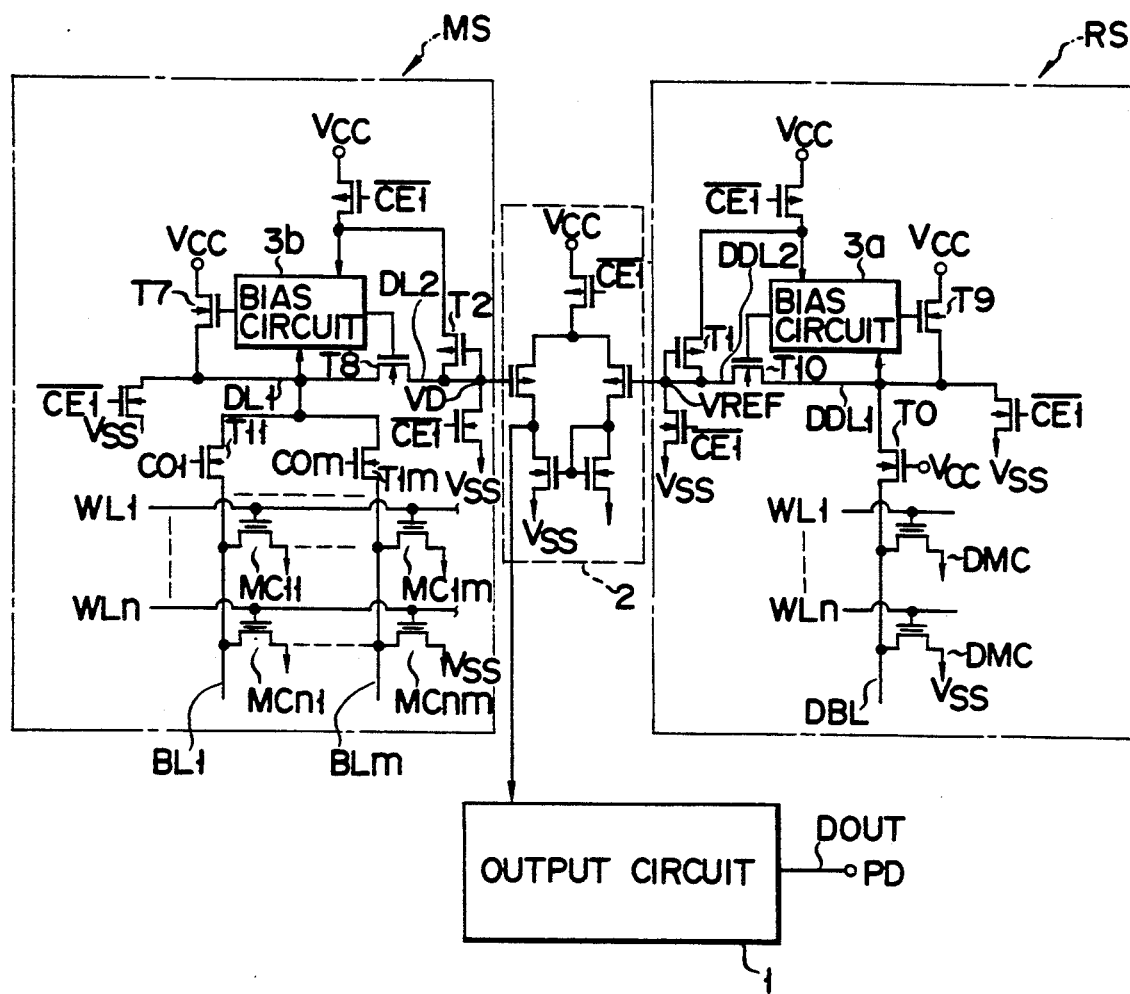
FIGS. 1A and 1B are circuit diagrams showing the construction of a memory circuit of the conventional EPROM.
Figure 1B:
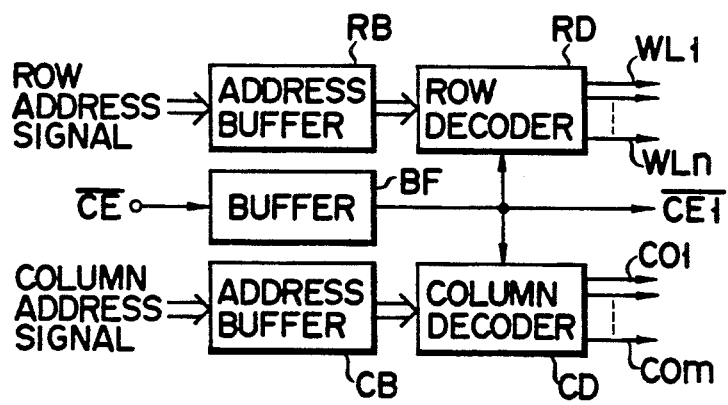
Figure 2A:
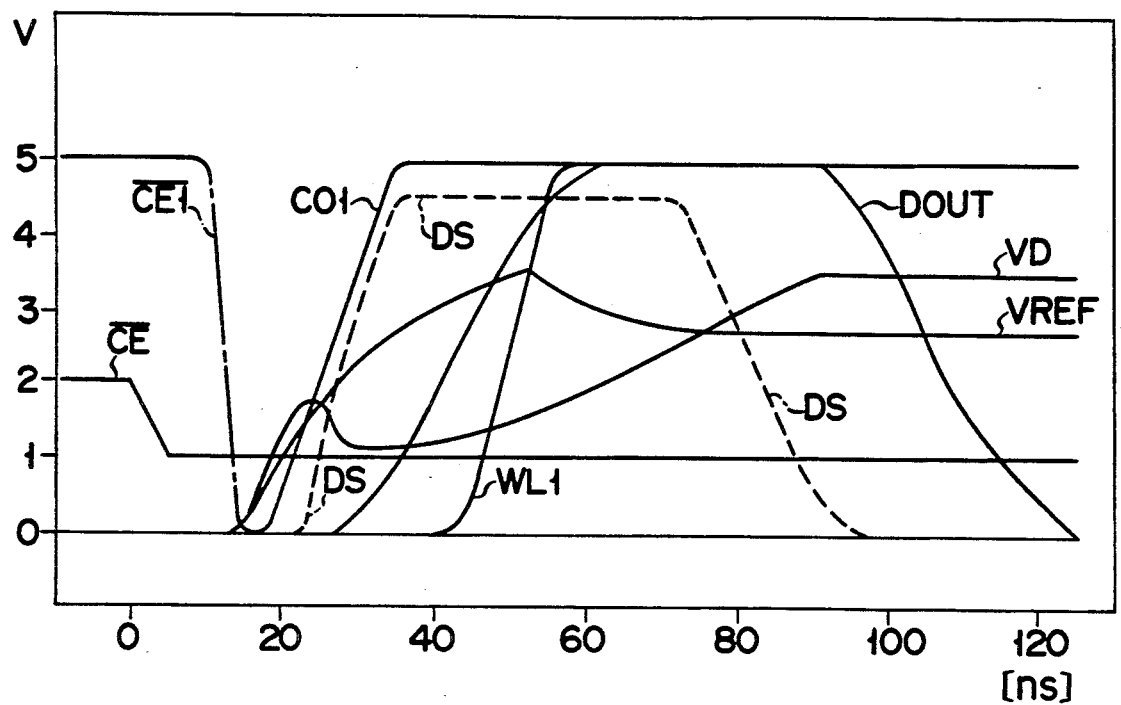
FIGS. 2A and 2B are waveform diagrams of signals in the memory circuit of FIGS. 1A and 1B.
Figure 2B:
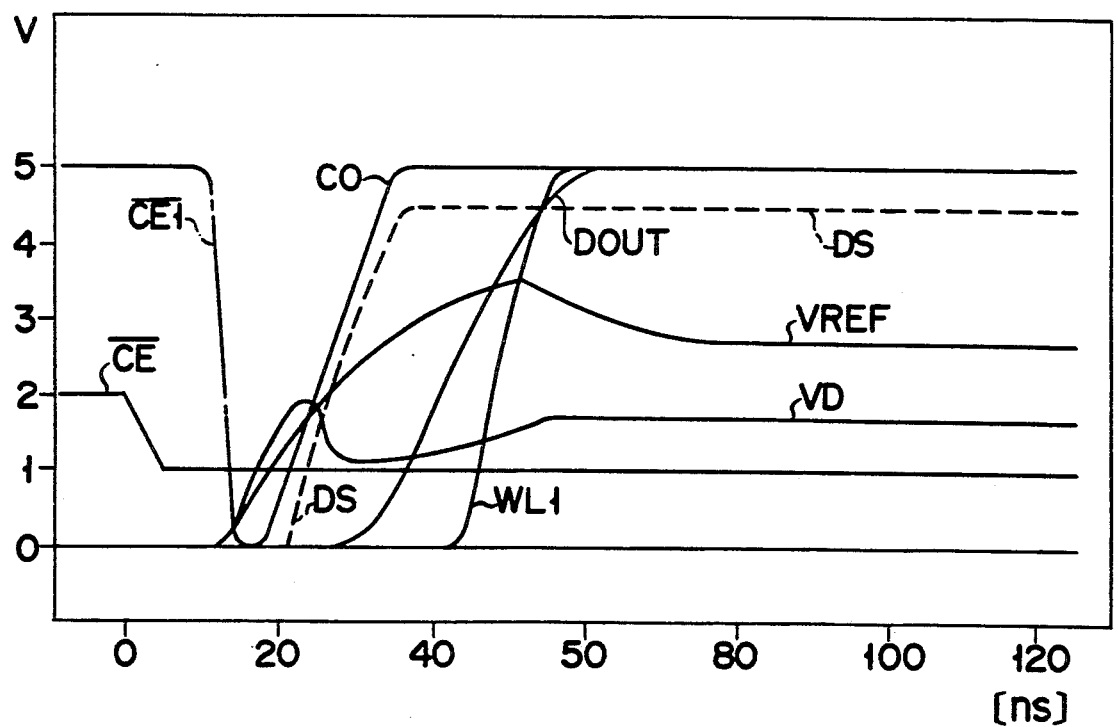
Figure 3A:
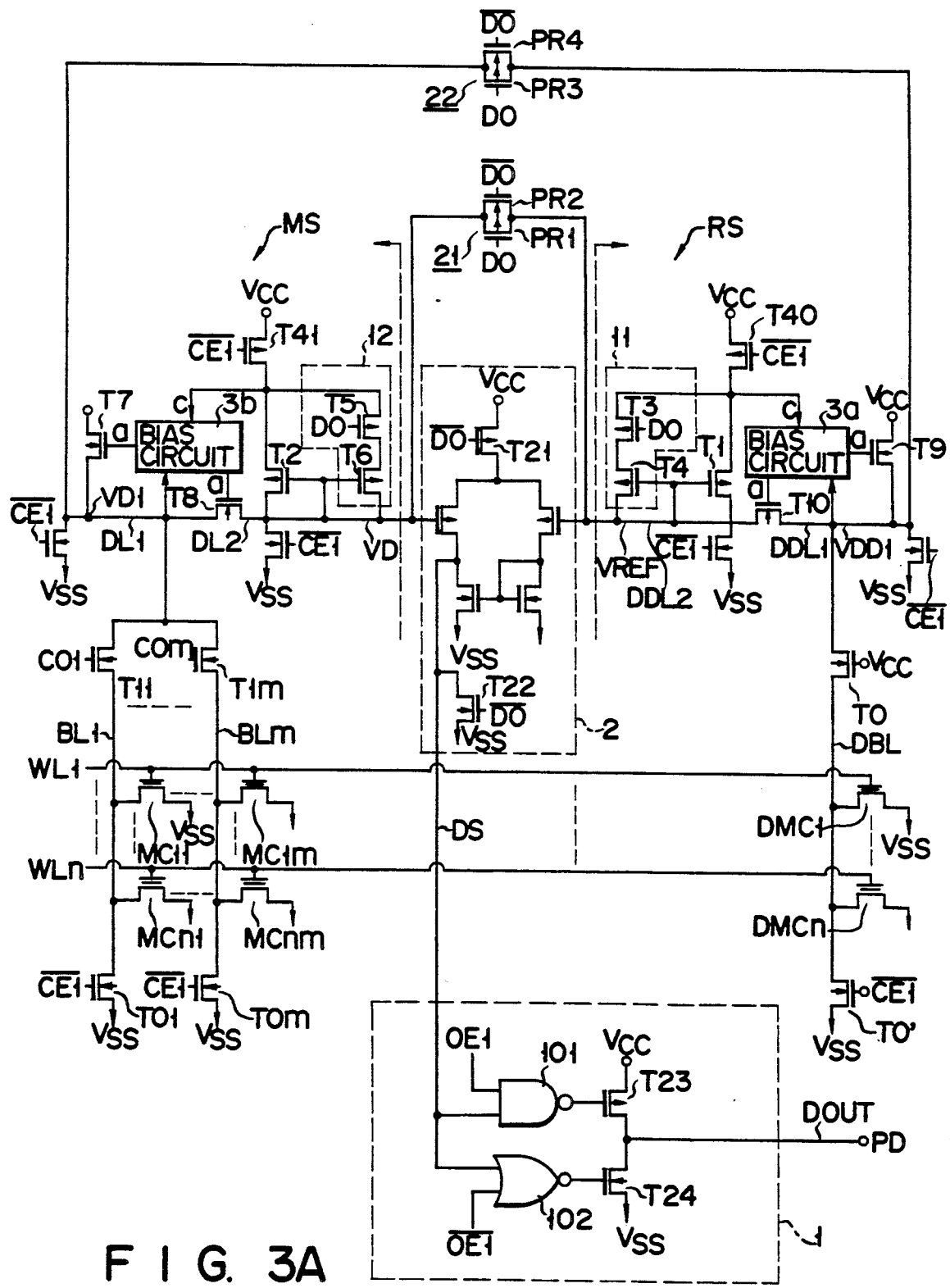

FIGS. 3A and 3B are circuit diagrams showing a memory circuit of the EPROM. As in the conventional EPROM shown in FIGS. 1A and 1B, the EPROM of FIGS. 3A and 3B includes data sensing circuit 2 which is formed to compare potential VD of data line DL2 which is set according to data "1" or "0" read out from one of memory cells MC11 to MCnm of main circuit MS and potential VREF of reference potential generating circuit RS which is set by reading out data "1" from one of dummy cells DMC1 to DMCn, and data read out from the memory cell is determined according to the comparison result or the difference between the compared potentials. Dummy data lines DDL1 and DDL2 and data lines DL1 and DL2 are connected to charging load transistors T1 and T2 as in the conventional case and further connected to charging circuits 11 and 12 for attaining high speed charging operation.

Charging circuit 11 is constituted to include P-channel MOS transistors T3 and T4 connected in series, and the supply of power source voltage to charging circuit 11 is controlled by means of P-channel MOS transistor T40 whose conduction state is controlled by chip enable signal $\overline{CE1}$ as in the case of load transistor T1. The gate of P-channel MOS transistor T3 is connected to receive control signal DO which is generated from timing control circuit TC in order to control the operation of charging circuit 11. Control signal DO is obtained by delaying chip enable signal $\overline{CE1}$ by a certain period of time, and is raised from "0" level to "1" level after one of word lines WL1 to WLm is set to the readout potential. In other words, load transistor T1 and charging circuit 11 are operated to charge dummy data lines DDL1 and DDL2, and dummy bit line DBL at a high speed in a period of time from fall of chip enable signal $\overline{CE1}$ to rise of control signal DO. When control signal DO is set to "1" level, only load transistor T1 is operated to effect the charging operation.

Likewise, charging circuit 12 is constituted to include P-channel MOS transistors T5 and T6 connected in series, and supply of power source voltage to charging circuit 12 is controlled by means of P-channel MOS transistor T41 whose conduction state is controlled by chip enable signal $\overline{CE1}$. Also, charging circuit 12 is controlled by control signal DO. Thus, load transistor T2 and charging circuit 12 are operated to effect the charging operation in a period of time from the fall of chip enable signal $\overline{CE1}$ to the rise of control signal DO.

Further, the EPROM includes first equalizer circuit 21 for causing the potential difference between data line DL2 and dummy data line DDL2 to be reduced or set to zero and second equalizer circuit 22 for causing the potential difference between data line DL1 and dummy data line DDL1 to be reduced or set to zero.

Equalizer circuit 21 includes a parallel circuit of P-channel MOS transistor PR1 and N-channel MOS transistor PR2 whose gates are connected to receive control signal DO and the inverted signal $\overline{DO}$ of control signal DO, respectively. More specifically, equalizer circuit 21 electrically connects data line DL2 with dummy data line DDL2 until control signal DO is set to "1" level.

Equalizer circuit 22 includes a parallel circuit of P-channel MOS transistor PR3 and N-channel MOS transistor PR4 whose gates are connected to receive control signal DO and the inverted signal $\overline{DO}$ of control signal DO, respectively. More specifically, equalizer circuit 22 electrically connects data line DL1 with dummy data line DDL1 until control signal DO is set to "1" level.

Potential VD1 of data line DL2 is changed when data is read out from selected memory cell MC. The variation in potential VD1 is amplified and the amplified variation is supplied to sensing circuit 2 as potential VD. For this purpose, for example, there are further provided bias circuit 3b constituted by an inverter including P-channel MOS transistor T30 and N-channel MOS transistor T31 having a threshold voltage of substantially 0 V, as shown in FIG. 4, load N-channel MOS transistor T7 whose conduction state is controlled by an output a of bias circuit 3b and transfer gate N channel MOS transistor T8 for level shifting. N-channel MOS transistor T8 is used to separate level shifted potential VD and potential VD1 from each other.

Likewise, bias circuit 3a, load N-channel MOS transistor T9 and transfer gate N-channel MOS transistor T10 for level shifting are connected to dummy data line DDL. Bias circuit 3a is also constituted by an inverter as shown in FIG. 4.

Sensing circuit 2 of FIG. 3A has an ordinary structure of a differential amplifier. However, since control signal $\overline{DO}$ is supplied to the gate of P-channel MOS transistor T21, it is driven at the time of fall of control signal $\overline{DO}$ unlike the prior art case in which the sensing circuit is driven is response to chip enable signal $\overline{CE1}$. Output data line DS of sensing circuit 2 is connected to one end of N-channel MOS transistor T22 which is grounded at the other end and which has a gate connected to receive control signal $\overline{DO}$. With this construction, the potential of output data line DS can be set stable in a period from fall of chip enable signal $\overline{CE1}$ to fall of control signal $\overline{DO}$.

As in the prior art case, output circuit 1 is constituted to include an output buffer circuit having P-channel MOS transistor T23 and N-channel MOS transistor T24, NAND gate 101 having one input terminal connected to receive output enable signal OE1 and the other input terminal connected to receive an output of sensing circuit 2, and NOR gate 102 having one input terminal connected to receive signal $\overline{OE1}$ and the other input terminal connected to receive signal DS. An output of NAND gate 101 is supplied to the gate of transistor T23 and an output of NOR gate 102 is supplied to the gate of transistor T24. An output of the output buffer circuit is supplied as output data DOUT from output pad PD to the exterior.

N-channel MOS transistors T01 to T0m provided for respective bit lines and N-channel MOS transistor T0' provided for dummy bit line DBL are connected to receive chip enable signal $\overline{CE1}$ at their gates and are used to set the potentials of bit lines BL1 to BLm and dummy bit line DBL to the ground potential.

N-channel MOS transistor T0 is provided to correspond to column selection transistors T11 to T1m of main circuit MS, and is always set in the conductive state.

There will now be described an operation of the EPROM. In order to make clearer the effect obtained by using equalizers 21 and 22, the operation of the case in which equalizers 21 and 22 are omitted from the semiconductor memory of FIGS. 3A and 3B is first explained with reference to FIGS. 5A and 5B.

FIG. 5A is a waveform diagram showing the waveforms obtained in the case where data "0" is read out from memory cell MC11, and FIG. 5B is a waveform diagram showing the waveforms obtained in the case where data "1" is read out from memory cell MC11. When chip enable signal $\overline{CE1}$ falls, the operation of charging data lines DL1 and DL2 is effected. At the time, MOS transistors T11 to T1m remain in the nonconductive state. The operation of charging one of bit lines BL1 to BLm is not effected before the decoding operation of column decoder CD is completed. Further, the charging speed is enhanced by means of charging circuit 12. Therefore, the potentials of data lines DL1 and DL2 rise at a high rate immediately after the charging operation is started. In contrast, since transistor T0 is always set in the conductive state, dummy data lines DDL1 and DDL2 are charged together with dummy bit lines DBL immediately after the fall of chip enable signal $\overline{CE}$. As shown in FIGS. 5A and 5B, output potential VREF from reference potential generating circuit RS is first set to be lower than output potential VD from main circuit MS. In this circuit, chip enable signal $\overline{CE1}$ is supplied to the gate of transistor T0'. Therefore, transistor T0' is turned off when chip enable signal $\overline{CE1}$ falls.

Column selection signals CO1 to COm from column decoder CD are all set at "0" level in the standby mode in which chip enable signal $\overline{CE1}$ is set at "1" level. When chip enable signal $\overline{CE1}$ falls from "1" level to "0" level to set the active state, one of column signals CO1 to COm is selectively set to "1" level to selectively turn on a corresponding one of column selection transistors T11 to T1m. At this time, the operation of charging dummy bit line DBL is already started, and dummy bit line DBL is set at the same potential as that of dummy data lines DDL1 and DDL2. After this, the operation of charging one of bit lines BL1 to BLm is started In this case, if charging circuit 12 and load transistor T2 have substantially the same charging ability as reference potential generating circuit RS, potential VD becomes lower than potential VREF. If the charging operation is continuously effected in this condition, the difference between potentials VD and VREF is not reduced. After the operation of row decoder RD is completed and the readout condition in which data can be read out from a selected memory cell is set up, control signal DO rises and signal $\overline{DO}$ falls, interrupting the charging operation of charging circuits 11 and 12. When data is supplied from sensing circuit 2 to output circuit 1, and if data "0" is read out from the memory cell as shown in FIG. 5A, the determination of output data is delayed by a time corresponding to the difference between potentials VREF and VD. As shown in FIG. 5A, output data DS from sensing circuit 2 indicates "1" in a period from the time that sensing circuit 2 is activated by control signal DO to the time that the levels of potentials VREF and VD are reversed, and erroneous data Dout is supplied to the exterior.

In order to prevent output of such erroneous data, equalizer circuits 21 and 22 are used in the semiconductor memory of this invention, and potentials VD and VD1 are respectively equalized with potentials VREF and VDD1.

Next, the operation attained in a case where equalizer circuits 21 and 22 are used in explained with reference to FIGS. 6A and 6B. When chip enable signal $\overline{CE1}$ falls, the operation of charging dummy data lines DDL1 and DDL2, and dummy bit line DBL is started as described before. However, in this case, charging circuit is supplied from from the main circuit to dummy data lines DDL1 and DDL2 via equalizer circuits 21 and 22, and therefore the difference between potentials VD and VREF will not increase. Further, when any one of column selection signals CO1 to COn is set to "1" level and a corresponding one of column selection transistors T11 to T1m is turned on to charge the bit line, charging current is supplied from reference potential generating circuit RS to data lines DL1 and LD2 via equalizer circuits 21 and 22. Therefore, the difference between potentials VD and VREF will not increase. Further, when control signal DO falls and control signal $\overline{DO}$ rises, the charging operation of charging circuits 11 and 12 and the equalizing operation of equalizer circuits 21 and 22 are stopped, and sensing circuit 2 is made operable. Then, data lines DL2 and DDL2 are continued to be charged by means of load transistors T1 and T2. Potential VREF is set higher than potential VD in FIG. 6B. This is because the charging ability of load transistor T1 is higher than that of load transistor T2. When data of "1" is read out, discharging current is started to flow from each of data lines LD2 and DDL2. In this case, if potentials VD1 and VD are respectively set equal to potentials VDDI and VREF immediately before the level change of signals DO and $\overline{DO}$, potential VD from main circuit MS is lowered at a higher speed since the same amount of the discharging currents flow through the memory cell and dummy cell. Therefore, as shown in FIG. 6B, the relation between the levels of potentials VREF and VD can be rapidly determined at the time of readout of data "1". In contrast, as shown in FIG. 6A, data "0" is read out, potential VREF from the reference potential generating circuit is lowered as described before. On the other hand, potential VD from main circuit MS rises to a stable level by the charging operation since data line DL2 is not discharged via the memory cell. As a result, the levels of potentials VREF and VD are not reversed. In this way, data readout of "1" and "0" can be correctly effected at a high speed.

The above-described embodiment has charging circuits 11 and 12. Circuits 11 and 12 can be omitted if the parasitic capacitances of the data and bit lines are relatively low. When charging circuit 11 is omitted, and one of the following expressions (1) or (2) is satisfied, the current driving ability of equalizer circuit 21 will be lowered.

(the current driving ability of load transistor $T1$) = (the current driving ability of load transistor $T2$) + (the current driving ability of charging circuit 12)    (1)

(the current driving ability of load transistor $T1$) + (the current driving ability of charging circuit 11) = (the current driving ability of load transistor $T2$) + (the current driving ability of charging circuit 12)    (2)

FIG. 9 is a modification of the memory cell arrangement of the memory device of FIGS. 3A and 3B. Dummy cells DMC11 to DMCnm are provided corresponding to memory cells MC11 to MCnm. Dummy bit lines DBL11 to DBLnm are connected to columns of dummy cells DMC11 to DMCnm, and word lines WL1 to WLn are connected to rows of dummy cells DMC11 to DMCnm. MOS transistors T11' to T1m' are provided for MOS transistors T11 to T1m, and are connected between data line DDL1 and respective dummy bit lines DBL11 to DBLnm. Output signals CO1 to of dummy cells DMC11 to DBLnm. Output signals CO1 to COm are supplied to the gates of MOS transistors T11' to T1m'. For example, dummy cells DMC11 to DMCnm store data items which are different from data items preset in respective memory cells MC11 to MCnm.

In the semiconductor memory described above, potentials VREF and VD, and potentials VDD1 and VD1 are equalized to each other by means of equalizing circuits 21 and 22. If equalizing circuit 22 is omitted so as not to equalize potentials VDD1 and VD1, then signal waveforms as shown in FIGS. 7A and 7B can be obtained. In this case, as shown in FIG. 7A, erroneous data temporarily appears in output DS from sensing circuit 2 because of the difference in the charging speed when cell data of "0" is read out. More specifically, as has been described the potential VD1 of data line DL1 varies a little. This small variation of potential VD1 is amplified and supplied to data line DL2 in order to achieve a high-speed operation. When the potentials of data lines DL1 and DDL1 are not equalized, the potential difference between these lines results in a potential difference between data lines DL2 and DDL2, as is shown by arrow A in FIG. 7A. Sensing circuit 2 detects this difference and outputs erroneous data, as is shown by arrow B in FIG. 7A. In order to prevent occurrence of the erroneous data and suppress the delay in the access operation because of the charging and discharging operation due to the occurrences of the erroneous data, it is very important to equalize not only potentials VD and VREF but also potentials VD1 and VDD1.

In the above explanation of the operation of the circuit, control signals DO and $\overline{DO}$ are obtained by delaying signals CE1 and $\overline{CE1}$, but it is also possible to obtain signals DO and $\overline{DO}$ in the pulse form in response to variation of signal $\overline{CE}$.

Figure 8:
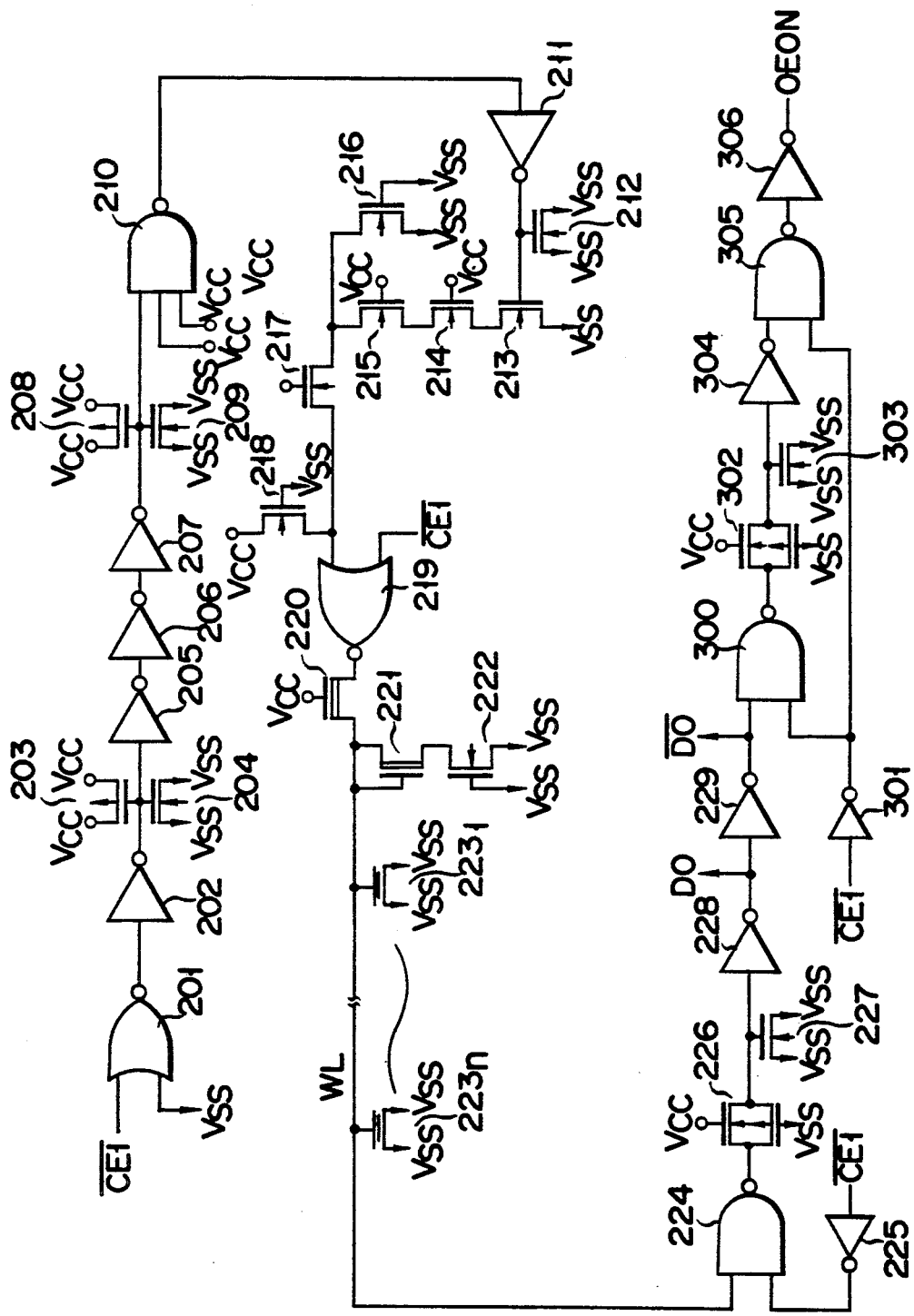
FIG. 8 is a circuit diagram showing the detailed construction of one example of a circuit for generating control signals used in the memory circuit of FIGS. 3A and 3B.

FIG. 8 shows the detail construction of a circuit for generation control signals DO and $\overline{DO}$. In order to start the detection operation of sensing circuit 2 in synchronism with rise of the potential of each of word line WL1 to WLm, the circuit of FIG. 8 delays signal $\overline{CE1}$ by means of a delay circuit including an equivalent circuit of word line WL1, row decoder RD and address buffer circuit RB, which are associated for selecting word line WL1. In FIG. 8, NOR gate 201, inverter 202, P-channel MOS transistor 203, N-channel MOS transistor 204 and inverters 205 to 207 correspond to address buffer circuit RB. P-channel MOS transistor 208, N-channel MOS transistor 209, NAND gate 210, inverter 211, N-channel MOS transistors 212 to 217, P-channel MOS transistor 218, NOR gate 219, depletion type transistors 220 and 221, and N-channel MOS transistor 222 correspond to row decoder RD, and floating gate transistors $223_1$ to $223_n$ corresponds to memory cells MC11 to MC1m connected to word line WL1. Line WL is a dummy row line corresponding to word line WL1. Line WL can be replaced by time constant circuit having capacitance and resistance not less than those of word line WL1. Further, NAND gate 224, inverter 225, transfer gate 226, N-channel MOS transistor 227 and inverter 228 correspond to the delay section for, for example, determining the timing of rise of signal DO after the potential of word line WL1 has reached a preset potential level. In this case, control signal DO is derived out from the output of inverter 228 and signal $\overline{DO}$ is derived out from the following stage inverter 229. Of the time constant of the dummy row line is set longer than that of word line WL1, the delay section can be omitted. Further, control signals DO and $\overline{DO}$ are delayed via NAND gate 300, inverter 301, transfer gate 302, N-channel MOS transistor 303, inverter 304, NAND gate 305 and inverter 306 so as to derive control signal OEON which is used to obtain output enable signals OE1 and $\overline{OE1}$.

Signal OEON is used to prevent data Dout from being generated in synchronism with output DS in a period from the time that the operation of data sensing circuit 2 is started in response to variation of signals DO and $\overline{DO}$ to the time that the potential of output data line DS of data sensing circuit 2 is determined. If signals OE1 and $\overline{OE1}$ are changed before signals DO and $\overline{DO}$ are changed, data "0" will be supplied to the exterior until correct data is output on data line DS in response to variation of signals DO and $\overline{DO}$ because, in this case, the potential of line DS is lowered to the ground potential by signal DO. Therefore, if signals OE1 and $\overline{OE1}$ are so set as to be changed after signals DO and $\overline{DO}$ are changed, transistors T23 and T24 are kept nonconductive in a period from the time that control signals DO and $\overline{DO}$ are changed to the time that signals OE1 and $\overline{OE1}$ are changed, thereby outputting no effective data. Thus, the potential of data line DS can be determined in the above period and it becomes possible to output correct data Dout.

It is preferable that dummy bit line DBL is formed to have substantially the same construction and is operated in substantially the same manner as bit lines BL1 to BLn of main circuit MS. For this purpose, it is possible to supply chip enable signal $\overline{CE1}$ to the gate of MOS transistor T0 so that MOS transistor T0 can be turned on when signal $\overline{CE1}$ is activated.

In the embodiment described above, equalizer circuit 22 includes MOS transistors PR3 and PR4. MOS transistor PR3 can be omitted. When MOS transistor PR3 is not used, it is preferable that MOS transistor PR4 has a lower threshold voltage. When MOS transistor PR4 has a threshold voltage of, for example, about 0V, the equalizing efficiency will be remarkably improved.

In the embodiment, chip enable signal $\overline{CE1}$ is input to NOR gate 219 so as to discharge dummy row line WL immediately after chip enable signal $\overline{CE1}$ rises to "1" level to set the memory device in the standby state, so that the memory service can be set in the active state. Therefore, dummy row line WL is reliably discharged even if the period is relatively short in which chip enable signal $\overline{CE1}$ is kept at "1" level.

Additionally, chip enable signal $\overline{CE1}$ is also input to NAND gate 224 through inverter 225, in order to achieve substantially the same object as has been described in the preceding paragraph, and the delay circuit constituted by transfer gate 226 and capacitance 227 is charged soon.

As described above, according to this invention, correct data can be read out at a high speed without influencing the content of the cell data. Further, since erroneous data is prevented from occurring in the output of sensing circuit 2, as a kind of hazard will not be generated to the exterior, thus attaining a highly reliable data readout operation.

What is claimed is:

1. A semiconductor memory device, comprising:
a plurality of row lines;
row selecting means for selecting one of said row lines and supplying a driving signal to the selected row line;
a plurality of memory cells respectively connected to said row lines;
a column line connected to said memory cells, the potential of said column line being varied in accordance with data stored in the memory cell driven by the driving signal;
a plurality of dummy cells respectively connected to said row lines;
a dummy column line connected to said dummy memory cells, the potential of said dummy column line being varied in accordance with data stored in the dummy cell driven by the driving signal;
data sensing means, connected to receive at a first input terminal a potential supplied from the column line and receive at a second input terminal a potential supplied from the dummy column line, for generating an output signal corresponding to a difference between the input potentials;
first transfer gate means, inserted between a first portion of said column line, which is connected to the memory cells, and a second portion of said column line, which is connected to the first input terminal of said data sensing means, for electrically separating the first portion of said column line from the second portion of said column line when the first portion of said column line is charged to a predetermined potential;
first charging means, connected to the second portion of said column line, for charging said column line when said semiconductor memory device is enabled;
second transfer gate means, inserted between a first portion of said dummy column line, which is connected to the dummy cells, and a second portion of said dummy column line, which is connected to the second input terminal of said data sensing means, for electrically separating the first portion of said dummy column line from the second portion of said dummy column line when the first portion of said dummy column line is charged to the predetermined potential;
second charging means, connected to the second portion of said dummy column line, for charging said dummy column line when said semiconductor memory device is enabled;
first equalizing means, connected between the second portion of said column line and the second portion of said dummy column line, for equalizing potentials of the second portion of said column line and the second portion of said dummy column line for a preset period beginning after the semiconductor memory device is enabled and ending a predetermined time after said row selecting means supplies a driving signal to the selected row line, thereby causing the potential difference between the second portion of said column line and the second portion of said dummy column line to be reduced or equal to zero; and
second equalizing means, connected between the first portion of said column line and the first portion of said dummy column line, for equalizing potentials of the first portion of said column line and the first portion of said dummy column line for said preset period, thereby causing the potential difference between the first portion of said column line and the first portion of said dummy column line to be reduced or equal to zero.

2. A semiconductor memory device according to claim 1, wherein said data sensing means is made active after the selected row line has been set at a predetermined potential corresponding to the driving signal.

3. A semiconductor memory device according to claim 1, further comprising means for maintaining said column line and said dummy column line discharged until said semiconductor device is enabled.

4. A semiconductor memory device according to claim 1, wherein each of said memory cells and said dummy cells is constituted by a floating gate type MOS transistor.

5. A semiconductor memory device according to claim 1, further comprising third charging means, connected to the second portion of said column line, for charging said column line for said preset period.

6. A semiconductor memory device according to claim 5, further comprising fourth charging means, connected to the second portion of said dummy column line, for charging said dummy column line for said preset period.

7. A semiconductor memory device according to claim 5, wherein the total charging ability of said first and third charging means is substantially equal to the charging ability of said second charging means.

8. A semiconductor memory device according to claim 6, wherein the total charging ability of said first and third charging means is substantially equal to the total charging ability of said second and fourth charging means.

9. A semiconductor memory device according to claim 1, 4, or 6, wherein at least one of said first equalizing means and said second equalizing means starts to equalize the potentials of said column line and said dummy column line immediately after said semiconductor memory device is enabled.

10. A semiconductor memory device according to claim 1, 4, or 6, wherein the total number of dummy cells is equal to the number of said memory cells, and predetermined data items are stored in each of the dummy cells, a predetermined data item stored in each dummy cell being different from data stored in an associated memory cell.

11. A semiconductor memory device according to claim 1, 4, 5, or 6, wherein said preset period is equivalent to a period required for the potential of the selected row line to have reached a predetermined level after the semiconductor memory device is enabled.

12. A semiconductor memory device according to any one of claims 1 to 8, further comprising signal generating means, connected to receive a mode control signal, for generating an internal control signal in response to said mode control signal to control the operations of said first equalizing means and said second equalizing means.

13. A semiconductor memory device according to any one of claims 1 to 8, further comprising output means for generating output data in accordance with data supplied from said data sensing means, and inhibiting means for inhibiting said output means from generating output data during a period at least equal to said preset period.

14. A semiconductor memory device according to claim 13, wherein said inhibiting means is so constructed as to cause an output end of said output means to be set in a high impedance state, thereby inhibiting said output means from generating output data.

15. A semiconductor memory device according to claim 12, wherein said signal generating means includes a dummy row line having a resistance and capacitance not less than those of said selected row line, so as to terminate the operations of said first equalizing means and said second equalizing means by detecting that the potential of said dummy row line has reached a predetermined level after said semiconductor memory device is enabled, and then changing the logic value of said internal control signal.

16. A semiconductor memory device according to claim 12, wherein said signal generating means includes a dummy row line electrically equivalent to a circuit constituted by said selected row line and the memory cell connected to said row line, so as to terminate the operations of said first equalizing means and said second equalizing means by detecting that the potential of said dummy row line has reached a predetermined level after said semiconductor memory device is enabled, and then changing the logic value of said internal control signal.

17. A semiconductor memory device according to claim 15, wherein said signal generating means, further includes detecting means for detecting that the potential of said dummy row line has reached the predetermined level, and delay means for delaying an output signal of said detecting means so as to terminate the operations of said first equalizing means and said second equalizing means by changing the logic value of the internal control signal when the output signal supplied from said delay means is changed.

18. A semiconductor memory device according to claim 15, further comprising address buffer means, connected to receive an address signal, for causing a received address signal to have an amplitude suitable for said row selecting means, and wherein said signal generating means further includes an equivalent circuit of said address buffer means and row selecting means.

19. A semiconductor memory device according to claim 15 further comprising output means for generating output data in accordance with data supplied from said data sensing means, and in which said signal generating means includes delay means for delaying the internal control signal, and inhibiting means for inhibiting said output means from generating output data, in response to an output signal from said delay means.

20. A semiconductor memory device according to claim 6, wherein
said first charging means includes a first MOS transistor having a current path connected at one end to a power source terminal and a gate connected to receive a mode control signal, and a second MOS transistor having a current path connected in series between the other end of the current path of said first MOS transistor and the second portion of said column line;
said third charging means includes a first MOS transistor having a current path connected at one end to the junction of the current paths of said first and second MOS transistors of said first charging means and a gate connected to receive an internal control signal, and a second MOS transistor having a current path connected in series between the other end of the current path of said first MOS transistor of said third charging means and the second portion of said column line;
said second charging means includes a first MOS transistor having a current path connected at one end to said power source terminal and a gate connected to receive said mode control signal, and a second MOS transistor having a current path connected in series between the other end of the current path of said first MOS transistor of said second charging means and the second portion of said dummy column line and a gate connected to the second portion of said dummy column line; and said fourth charging means includes a first MOS transistor having a current path connected at one end to the junction of said first and second MOS transistors of said second charging means and a gate connected to receive said internal control signal, and a second MOS transistor having a current path connected in series between the other end of the current path of said first MOS transistor of said fourth charging means and the second portion of said dummy column line and a gate connected to the second portion of said dummy column line.

21. A semiconductor memory device according to claim 1, 4, or 6, further comprising additional memory cells, additional column lines each connected to the additional memory cells in a corresponding column, and column selecting means for selecting one of said column lines.

22. A semiconductor memory device according to claim 10, wherein said preset period is equivalent to a period required for the potential of a selected row line to reach a predetermined level after the semiconductor memory device is enabled.

23. A semiconductor memory device according to claim 10, further comprising output means for generating output data in accordance with data supplied from said data sensing means, and inhibiting means for inhibiting said output means from generating output data during a period at least equal to said preset period.

24. A semiconductor memory device according to claim 17, further comprising output means for generating output data in accordance with data supplied from said data sensing means, and in which said signal generating means further includes a second delay means for delaying the internal control signal, and inhibiting means for inhibiting said output means from generating output data, in response to an output signal from said second delay means.

25. A semiconductor memory device according to claim 18, further comprising output means for generating output data in accordance with data supplied from said data sensing means, and in which said signal generating means includes delay means for delaying the internal control signal, and inhibiting means for inhibiting said output means from generating output data, in response to an output signal from said delay means.

26. A semiconductor memory device according to claim 19, further comprising additional memory cells, additional column lines each connected to the additional memory cells in a corresponding column, and column selecting means for selecting one of said column lines.

27. A semiconductor memory device according to claim 16, wherein said signal generating means further includes detecting means for detecting that the potential of said dummy row line has reached the predetermined level, and delay means for delaying an output signal of said detecting means so as to terminate the operations of said first equalizing means and said second equalizing means by changing the logic value of the internal control signal when the output signal supplied from said delay means is changed.

28. A semiconductor memory device according to claim 16, further comprising address buffer means, connected to receive an address signal, for causing a received address signal to have an amplitude suitable for said row selecting means, and wherein said signal generating means further includes an equivalent circuit of said address buffer means and row selecting means.

29. A semiconductor memory device according to claim 16, further comprising output means for generating output data in accordance with data supplied from said data sensing means, and in which said signal generating means includes delay means for delaying the mode control signal, and inhibiting means for inhibiting said output means from generating output data, in response to an output signal from said delay means.

30. A semiconductor memory device according to claim 27, further comprising output means for generating output data in accordance with data supplied from said data sensing means, and in which said signal generating means further includes a second delay means for delaying the mode control signal, and inhibiting means for inhibiting said output means from generating output data, in response to an output signal from said second delay means.

31. A semiconductor memory device according to claim 28, further comprising output means for generating output data in accordance with data supplied from said data sensing means, and in which said signal generating means includes delay means for delaying the internal control signal, and inhibiting means for inhibiting said output means from generating output data, in response to an output signal from said delay means.

32. A semiconductor memory device according to claim 29, further comprising additional memory cells, additional column lines each connected to the additional memory cells in a corresponding column, and column selecting means for selecting one of said column lines.

33. A semiconductor memory device, comprising:
a row decoder;
memory cells selectively driven by the row decoder;
a column decoder;
column gate transistors selectively driven by the column decoder;
a first transfer gate MOS transistor having a current path at one end connected to said memory cells through current paths of said column gate transistors and a gate connected to receive a control voltage lower than a power source voltage;
a first load MOS transistor of a P-channel type connected to provide a current path between a power source and the other end of the current path of said first transfer gate MOS transistor;
a first precharge MOS transistor of the P-channel type connected to provide a current path between the power source and the other end of the current path of said first transfer gate MOS transistor;
dummy cells selectively driven by said row decoder;
a second transfer gate MOS transistor having a current path connected at one end of said dummy cells and a gate connected to receive a control voltage lower than the power source voltage;
a second load transistor of the P-channel type connected to provide a current path between the power source and the other end of the current path of said second transfer gate MOS transistor;
a second precharge MOS transistor of the P-channel type connected to provide a current path between the power source and the other end of the current path of said second transfer gate MOS transistor;
a first switching MOS transistor providing a current path connected between the other ends of said first and second transfer gate MOS transistors until a predetermined time after said row decoder supplies a driving signal to the memory cells;

a second switching MOS transistor having a current path connected between the one ends of said first and second transfer gate MOS transistors; and a data sensing circuit having first and second input terminals connected to the other ends of said first and second transfer gate MOS transistors.

34. A semiconductor memory device, comprising:
a row decoder;
row lines selectively driven by said row decoder;
memory cells connected to said row lines;
column lines connected to receive data from the memory cells;
a column decoder for selecting said column lines;
dummy cells connected to said row lines;
a dummy column line connected to receive data from the dummy cells;
a data sensing circuit connected at one end to the column lines and at the other end to the dummy column line;
a first load circuit connected to the column lines;
a second load circuit connected to the dummy column line;
a first MOS transistor, having a current path connected between said first load circuit and the column lines, for preventing the memory cells from being set to a potential higher than a predetermined potential;
a second MOS transistor, having a current path connected between said second load circuit and the dummy column line, for preventing the dummy cells from being set to a potential higher than a predetermined potential;
a first equalizer circuit for selectively connecting one end of the current path of said first MOS transistor and one end of the current path of said second MOS transistor for a predetermined time after said row decoder supplies a driving signal to a selected row line; and
a second equalizer circuit for selectively connecting the other end of the current path of said first MOS transistor and the other end of the current path of said second MOS transistor.

35. A semiconductor memory device according to claim 4, wherein said first equalizer circuit includes a switching transistor connected between the one ends of the current paths of said first and second MOS transistors, and said second equalizer circuit includes a switching transistor connected between the other ends of the current paths of said first and second MOS transistors.

* * * * *